US012096640B2

(12) United States Patent
Boivin

(10) Patent No.: US 12,096,640 B2
(45) Date of Patent: Sep. 17, 2024

(54) RESISTIVE MEMORY CELL HAVING AN OVONIC THRESHOLD SWITCH

(71) Applicant: STMicroelectronics (Rousset) SAS, Rousset (FR)

(72) Inventor: Philippe Boivin, Venelles (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 18/193,965

(22) Filed: Mar. 31, 2023

(65) Prior Publication Data

US 2023/0240082 A1  Jul. 27, 2023

Related U.S. Application Data

(60) Continuation of application No. 17/409,612, filed on Aug. 23, 2021, now Pat. No. 11,637,144, which is a division of application No. 16/566,794, filed on Sep. 10, 2019, now Pat. No. 11,114,502.

(30) Foreign Application Priority Data

Sep. 21, 2018 (FR) ..................................... 1858602

(51) Int. Cl.
*H10B 63/00* (2023.01)
*H10N 70/00* (2023.01)
*H10N 70/20* (2023.01)

(52) U.S. Cl.
CPC .......... *H10B 63/24* (2023.02); *H10N 70/021* (2023.02); *H10N 70/063* (2023.02); *H10N 70/231* (2023.02)

(58) Field of Classification Search
CPC .... H10B 63/24; H10B 70/021; H10B 70/063; H10B 70/231
USPC ........................................................ 438/133
See application file for complete search history.

(56) References Cited

U.S. PATENT DOCUMENTS

| | | | |
|---|---|---|---|
| 9,991,316 B2 | 6/2018 | Zuliani et al. | |
| 9,997,703 B2 | 6/2018 | Lam et al. | |
| 2009/0230378 A1 | 9/2009 | Ryoo et al. | |
| 2017/0317143 A1 | 11/2017 | Chen et al. | |
| 2018/0033826 A1 | 2/2018 | Choi et al. | |
| 2018/0151623 A1 | 5/2018 | Terai | |
| 2019/0198570 A1 | 6/2019 | Navarro | |
| 2020/0075852 A1 | 3/2020 | Seong et al. | |
| 2020/0388650 A1* | 12/2020 | Nardi ................. | H10N 70/8613 |

FOREIGN PATENT DOCUMENTS

CN         108110027 A     6/2018
WO     2017222525 A1    12/2017

OTHER PUBLICATIONS

Kau et al., "A stackable cross point Phase Change Memory," 2009 IEEE International Electron Devices Meeting (IEDM), Baltimore, MD, Dec. 7-9, 2009.

(Continued)

*Primary Examiner* — Hoai V Pham

(57) ABSTRACT

The disclosure concerns a resistive memory cell, including a stack of a selector, of a resistive element, and of a layer of phase-change material, the selector having no physical contact with the phase-change material. In one embodiment, the selector is an ovonic threshold switch formed on a conductive track of a metallization level.

20 Claims, 6 Drawing Sheets

(56) References Cited

OTHER PUBLICATIONS

Jo et al., "3D-stackable crossbar resistive memory based on Field Assisted Superlinear Threshold (FAST) selector," 2014 IEEE International Electron Devices Meeting, San Francisco, CA, Dec. 15-17, 2014.

Verdy et al., "Improved Electrical Performance Thanks to Sb and N Doping in Se-Rich GeSe-Based OTS Selector Devices," 2017 IEEE International Memory Workshop (IMW), Monterey, CA, May 14-17, 2017.

* cited by examiner

RESISTIVE MEMORY CELL HAVING AN OVONIC THRESHOLD SWITCH

BACKGROUND

Technical Field

The present disclosure generally concerns memory devices, and more particularly resistive memory devices, for example, phase-change memory devices.

Description of the Related Art

Memories are generally in the form of arrays, comprising word lines and bit lines, that is, rows and columns. A memory cell, containing binary information, is located at each crossing of a row and of a column.

In a phase-change memory cell, for example, each memory cell comprises a layer of phase-change material which is in contact with a resistive element. Phase-change materials are materials which may switch between a crystal phase and an amorphous phase. Such a switching is caused by an increase in the temperature of the resistive element through which an electric current is conducted. The difference in electric resistance between the amorphous phase of the material and its crystal phase is used to define at least two memory states, arbitrarily 0 and 1.

The data contained in a cell of a phase-change memory are for example, accessed, or read out, by measurement of the resistance between the bit line and the word line of the memory cell.

The memory cells are generally associated with a selection element, for example, a selection transistor. On writing into or reading from a cell, the selection element enables current to flow through the resistive element of the cell. The selection element thus enables to limit the current flowing through the other memory cells (not selected) and which might disturb the reading from or the writing into the cell.

The selection elements are generally formed inside and/or on top of a semiconductor substrate. A disadvantage is that the memory cells are then limited in terms of density and location by the possible density and locations of the selection elements in the substrate.

BRIEF SUMMARY

An embodiment may overcome all or part of the disadvantages of known memory cells.

An embodiment provides a resistive memory cell, comprising a stack of a selector, of a resistive element, and of a layer of phase-change material, the selector having no physical contact with the phase-change material.

According to an embodiment, the resistive element has a substantially L-shaped cross-section.

According to an embodiment, the selector rests at least partially on a conductive track.

According to an embodiment, the selector has a substantially planar shape.

According to an embodiment, the selector comprises a stack of layers, the lower and upper layers of the stack being conductive layers.

According to an embodiment, the conductive layers are made of carbon.

According to an embodiment, each selector comprises a layer made of an alloy based on germanium and on selenium.

Another embodiment provides a memory device comprising a plurality of memory cells such as previously described, where each cell is located between levels of an interconnection network.

According to an embodiment, the distance between the lower surface of the selector and the upper surface of a conductive layer resting on the layer of phase-change material is substantially equal to a multiple of the thickness of a level of the interconnection network.

According to an embodiment, a device comprises at least two assemblies of memory cells, each assembly being located between two levels of the interconnection network.

Another embodiment provides a method of manufacturing phase-change memory cells, comprising forming stacks of a selector, of a resistive element, and of a layer of phase change material, the selectors having no mechanical contact with the phase-change material.

According to an embodiment, a method comprises a step of forming a planar layer of selectors covering a lower level of conductive tracks.

According to an embodiment, a method comprises:
forming an insulating layer above the layer of selectors;
forming a cavity crossing the insulating layer and having a wall opposite a conductive track of the lower level of conductive tracks;
depositing a resistive layer on the bottom and the walls of the cavity; and
at least partially etching the portion of the resistive and selector layers located at the bottom of the cavity.

According to an embodiment, a method comprises, before step a), etching the layer of selectors to form a strip extending from one conductive track to the other.

According to an embodiment, the cavity comprises two substantially parallel walls, each wall being opposite a conductive track.

The foregoing and other features and advantages will be discussed in detail in the following non-limiting description of specific embodiments in connection with the accompanying drawings.

DETAILED DESCRIPTION

Figure 1:
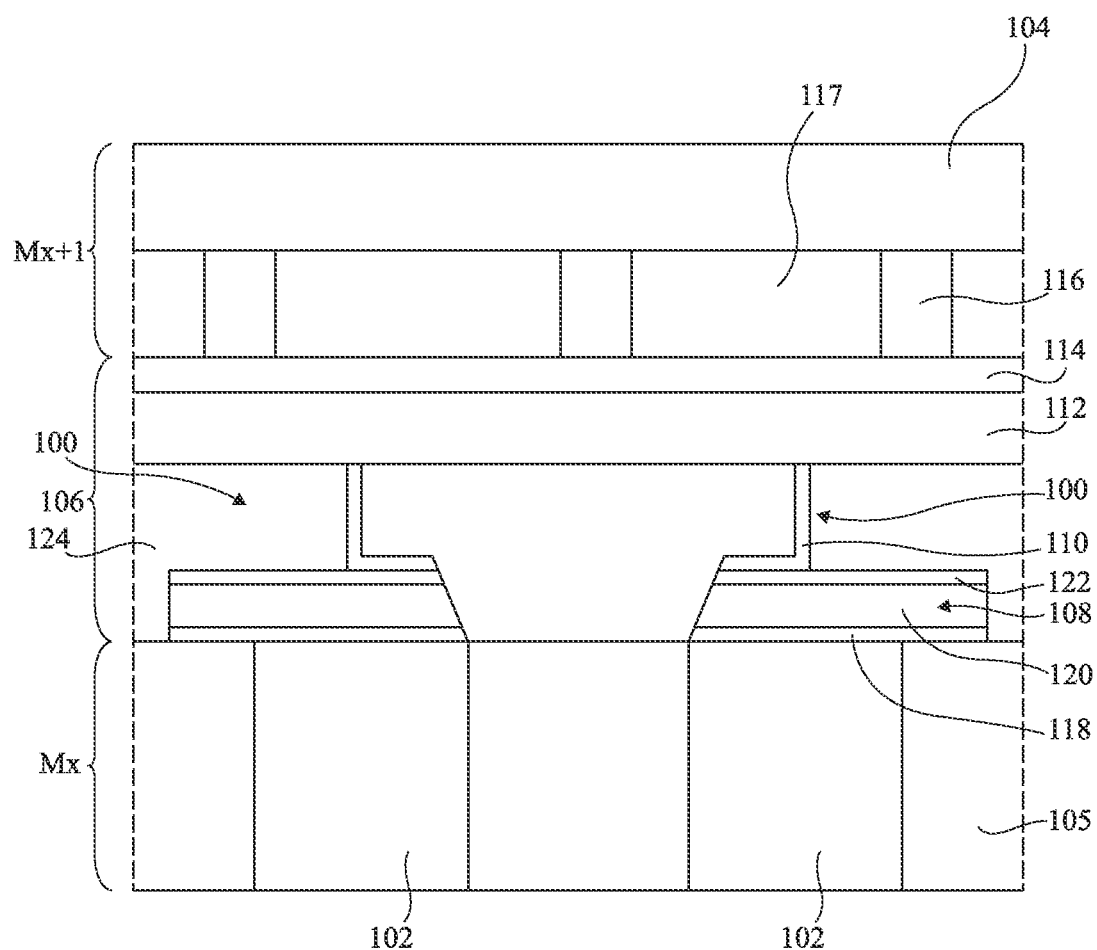
FIG. 1 schematically shows an embodiment of a memory device.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 schematically shows an embodiment of a memory device.

The memory device comprises an array of memory cells 100 located between two levels Mx and Mx+1 of conductive tracks of an interconnection network. The memory cells are thus not in mechanical contact with a substrate and, more particularly, they comprise no elements inside and/or directly on top of a semiconductor substrate.

Level Mx and Mx+1 of the interconnection network designates the level of conductive tracks number x and x+1 starting from a substrate, x being any number.

Each level Mx and Mx+1 comprises conductive tracks (designated with reference numeral 102 for level Mx and with reference numeral 104 for level Mx+1) and conductive vias (not shown for level Mx and designated with reference numeral 116 for level Mx+1). The conductive vias allow an electric connection with conductive elements located under the considered level, generally the conductive tracks of another level of the interconnection network or, in the described embodiment, of the memory cells. The conductive tracks and the conductive vias are surrounded with an insulating layer (designated with reference numeral 105 for level Mx and with reference numeral 117 for level Mx+1).

In the embodiment of FIG. 1, the memory cells 100 of a same row of the array are interconnected by one of the conductive tracks 102 of level Mx, and the memory cells 100 of a same column of the array are interconnected by one of the conductive tracks 104 of level Mx+1. It should be understood that the interconnections of the rows and columns may be inverted. The conductive tracks 104 (or 102) interconnecting the columns (or the rows) are substantially parallel to one another.

In FIG. 1, two memory cells 100 are shown. The two memory cells belong to a same column of the array. They are thus interconnected by the same conductive track 104. The two memory cells belong to two adjacent rows of the array. The two cells are thus connected to different conductive tracks 102.

Each memory cell comprises a stack 106 of a selector 108, of a resistive element 110, of a layer 112 of phase change material, and of a conductive layer 114. Layer 112 of phase-change material and conductive layer 114 are common to the memory cells of a same column. Selectors 108 and resistive elements 110 are separated from one another by insulating regions 124. Insulating regions 124 also separate layers 112 and 114 of the different columns from one another.

Selector 108 is an Ovonic Threshold Switch (OTS) that comprises a stack of three layers, a first conductive layer 118 in contact with at least a portion of the corresponding conductive track 102, a second layer 120 made of a chalcogenide, for example, an alloy based on germanium and on selenium, and a third conductive layer 122, enabling to prevent the diffusion of the material of layer 120. Conductive layers 118 and 122 are for example made of carbon. Conductive layer 118 enables to limit the diffusion of the material of layer 105 towards layer 120.

Selector 108 comprises two states: a first state where selector 108 has a sufficiently high resistance and conducts substantially zero current, and a second state where the selector has a sufficiently low resistance to conduct a non-zero current. Selector 108 switches from the first state to the second state when the voltage applied between its upper surface and its lower surface exceeds a threshold. The value of the threshold for example depends on the features of the chalcogenide layer and is selected based on the value of the voltage which will be provided to the memory cell during the reading or the writing. More particularly, the threshold value is selected in such a way that the selector 108 of the memory cell 100 which is desired to be read from or written into is in the second state and that the selectors 108 of all the other cells, receiving a lower voltage between their terminals, are in the first state.

The selectors 108 are passive components, that is, they receive no control current. Further, they are not located in the substrate.

The selector 108 of each memory cell is preferably substantially planar. Selector 108 is in electrical and physical contact with the conductive track 102 connecting the memory cells 100 of the considered row and with resistive element 110. Selector 108 is not in physical contact with phase-change material layer 112. Selector 108 is electrically coupled to layer 112 by resistive element 110.

Resistive element 110 for example has an L-shaped cross-section. The horizontal portion of resistive element 110 rests on selector 108. The vertical portion of resistive element 110 extends from selector 108 to layer 112 of phase-change material. The L shape of the resistive element enables it to have a wide contact with selector 108 and a thin contact with the phase-change material. The upper portion of the resistive element is thus more resistive than the lower portion, and the heating area is thus mainly at the level of the upper portion of the resistive element.

Conductive layer 114 is in contact, via the conductive vias 116 of level Mx+1, with the conductive track 104 interconnecting the memory cells of the considered column.

Preferably, the distance between the lower surface of the selector and the upper surface of conductive layer 114 is substantially equal to a multiple of the thickness of a level of the interconnection network. Thus, it is possible for levels Mx and Mx+1 not to be successive levels. For example, if the distance between the lower surface of the selector and the upper surface of conductive layer 114 is substantially equal to twice the thickness of a level of the interconnection network, the levels designated in FIG. 1 with references Mx and Mx+1 may be levels Mx and Mx+2. An advantage is that the regions of the interconnection network comprising memories and the portions which comprise no memories have coplanar levels.

FIGS. 2 to 5 illustrate successive steps of manufacturing of the embodiment of FIG. 1.

Figure 2:
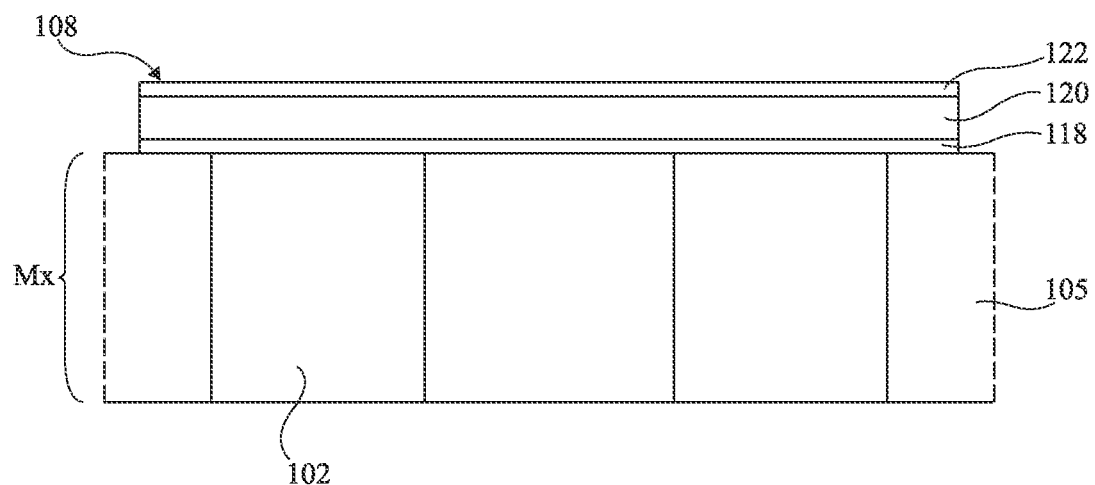
FIG. 2 schematically shows the result of steps of manufacturing of the embodiment of FIG. 1.

FIG. 2 schematically shows the result of steps of manufacturing of the embodiment of FIG. 1 during which level Mx of the interconnection network is formed. This comprises the forming of an insulating layer 105 having cavities etched therein and then filled with conductive material to form conductive tracks 102. Preferably, pairs of two adjacent conductive tracks 102, parallel to each other, have been formed. A single pair of conductive tracks 102 is shown in FIG. 1. Each of these conductive tracks is intended to interconnect a row of memory cells of the memory array.

A layer of selectors 108, that is, a stack of the layers forming selectors 108, is then formed on level Mx. For example, conductive layer 118, layer 120 made of a chalcogenide, and conductive layer 122 are formed on level Mx.

Conductive layers 118 and 122 for example have a thickness in the range from approximately 1 to approximately 5 nm. Layer 120 for example has a thickness in the range from approximately 7 to 50 nm, for example, 10 nm.

Selector layer 108 is then etched to form strips having their main direction, defined by the largest dimension, parallel to the main direction of conductive tracks 102. More particularly, each strip extends between two parallel conductive tracks 102. Each strip at least partially covers the two conductive tracks 102 and covers the portion of insulating layer 105 located between the two considered conductive tracks 102. A single strip is shown in FIG. 2.

Figure 3:
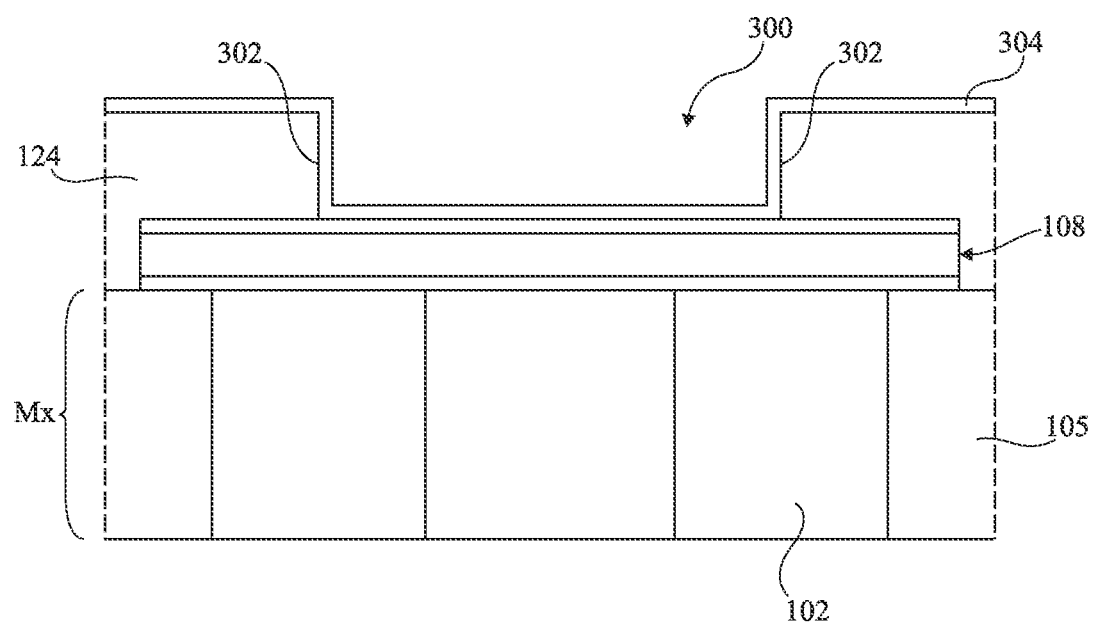
FIG. 3 schematically shows the result of other steps of manufacturing of the embodiment of FIG. 1.

FIG. 3 schematically shows the result of other steps of manufacturing of the embodiment of FIG. 1.

During these steps, an insulating layer, which will form insulating regions 124, is formed on selector layer 108 and on the portions of level Mx which are not covered with selector layer 108. The thickness of this insulating layer is substantially equal to the desired distance between a selector and the layer of phase-change material of a memory cell 100, that is, the height of the resistive element. The insulating layer is then etched to form a cavity 300 opposite each strip of selector layer 108. A single cavity 300 is shown in FIG. 3. Each cavity 300 crosses the insulating layer to reach selector layer 108. Each cavity 300 comprises two walls 302 parallel to each other, each wall 302 being located opposite one of the conductive tracks 102. Walls 302 thus have a main direction, that is, a direction defined by the largest dimension of the wall, parallel to the main direction of the associated conductive track 102.

Layer 304 of resistive material is then formed on insulating layer 124 and on the walls and the bottom of cavities 300. Layer 304 for example has a thickness in the range from approximately 3 to approximately 8 nm.

Figure 4:
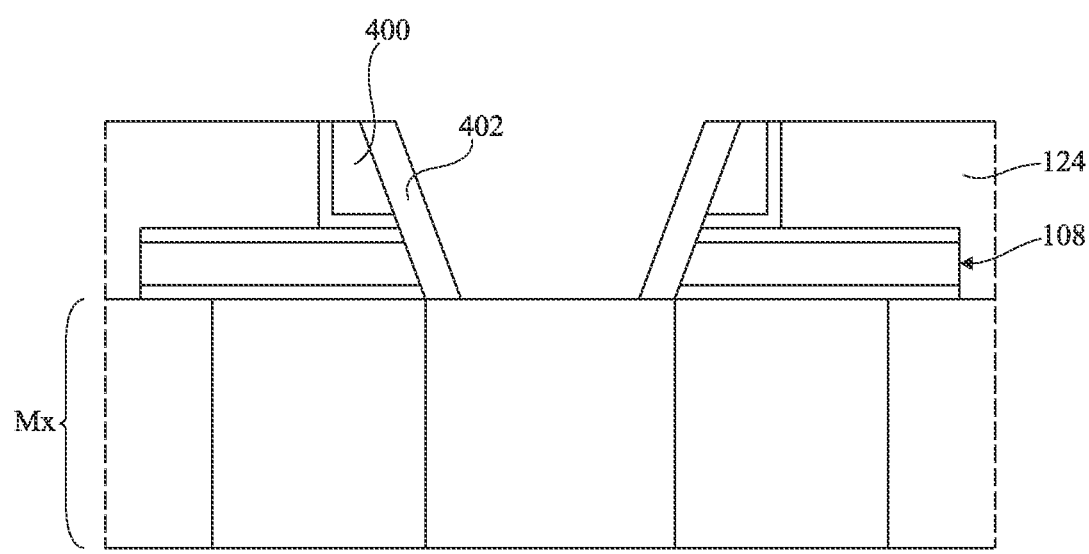
FIG. 4 schematically shows the result of other steps of manufacturing of the embodiment of FIG. 1.

FIG. 4 schematically shows the result of other steps of manufacturing of the embodiment of FIG. 1.

During these steps, spacers 400 are formed at the level of the walls of each cavity 300, covering the walls and a portion of the bottom of the cavity at the foot of the walls. During the etching of spacers 400, the portions of layer 304 of resistive material which are not covered with spacers 400 are removed, thus forming L-shaped resistive elements 110. The etching is maintained in the bottom of cavities 300 to reach level Mx.

Each strip of selector layer 108 is divided into two strips, each being at least partially opposite one of conductive tracks 102 and extending in a main direction parallel to the main direction of conductive track 102.

Second spacers 402 are formed on the first spacers and on the walls of selector layer 108 exposed during the previously-described etch step.

The upper surface of the vertical portion of each resistive element 110 remains exposed and is substantially coplanar to the upper surfaces of insulating regions 124.

Figure 5:
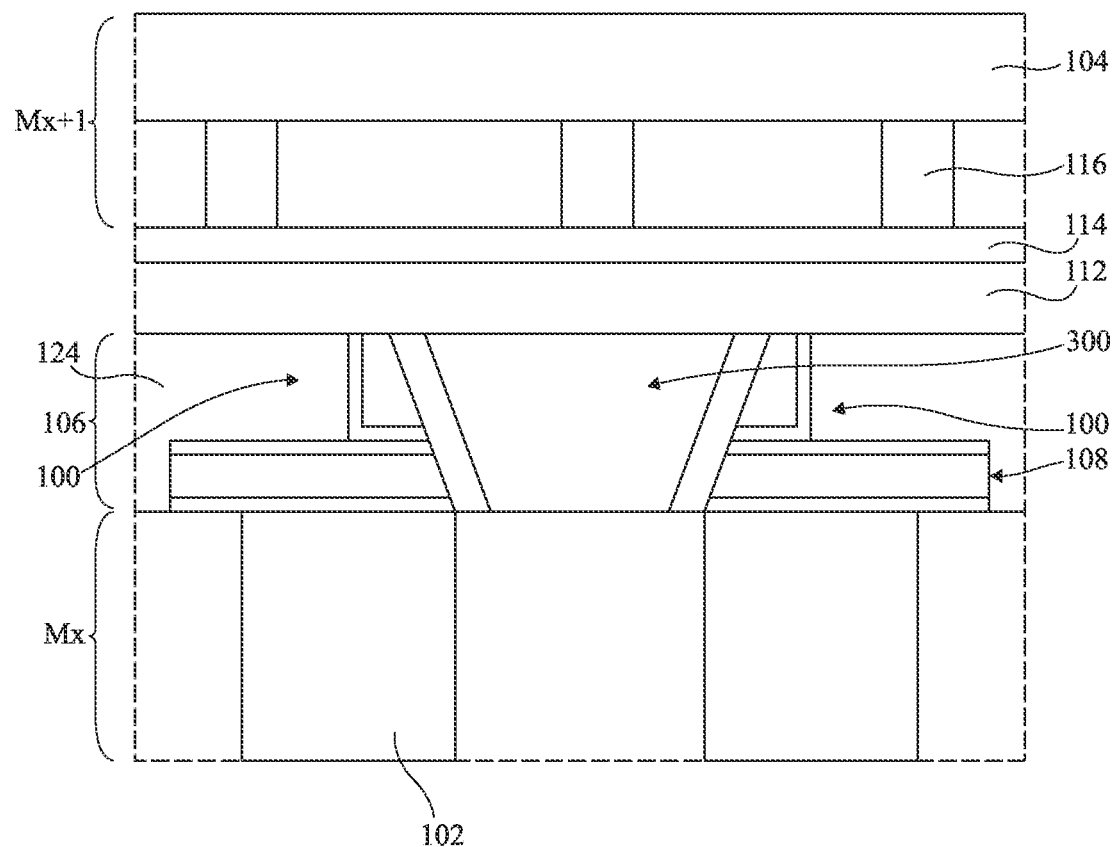
FIG. 5 schematically shows the result of other steps of manufacturing of the embodiment of FIG. 1.

FIG. 5 schematically shows the result of other steps of manufacturing of the embodiment of FIG. 1.

During these steps, each cavity 300 is filled with insulating material to form an insulating region 124 having its upper surface coplanar to the upper surface of the other regions 124.

Layer 112 of phase-change material and conductive layer 114 are formed over the entire structure obtained after the filling of cavity 300.

Trenches, not shown, extending through stack 106, that is, from conductive layer 114 to the upper surface of level Mx, are then etched. The trenches, located in planes parallel to the cross-section plane of FIG. 5, individualize the different memory cells of the rows of the array. Thus, each row comprises a plurality of memory cells separated by the trenches, not shown. The trenches are then filled with an insulating material to form insulating regions 124.

A step of forming level Mx+1 is then carried out. This step for example comprises forming one or a plurality of insulating layers into which cavities having the shape of conductive vias 116 and conductive tracks 104 are etched. The cavities are filled with conductive material.

As a variation, the etch step enabling to individualize the memory cells of each row may be carried out before the forming of layers 112 and 114. Layers 112 and 114 are then subsequently formed and etched. It is then possible to form resistive elements having a width different, for example, smaller, than the width of the strip of phase-change material.

It could have been devised to form selector layer 108 after the forming of cavity 300. Each selector 108 would then be substantially L-shaped and would be located between resistive element 110 and the walls of cavity 300. However, there would then be a mechanical contact between the upper surface of the vertical portion of selector 108 and layer 112 of phase-change material. A leakage current might then flows from the selector to the layer of phase-change material without crossing the resistive element, which would cause a power loss. Further, the temperature rise, during an operation of reading from or writing into the cell, would cause an interdiffusion between the materials of phase-change material layer 112 and selector 108, and thus a modification of the composition of layer 112.

Figure 6:
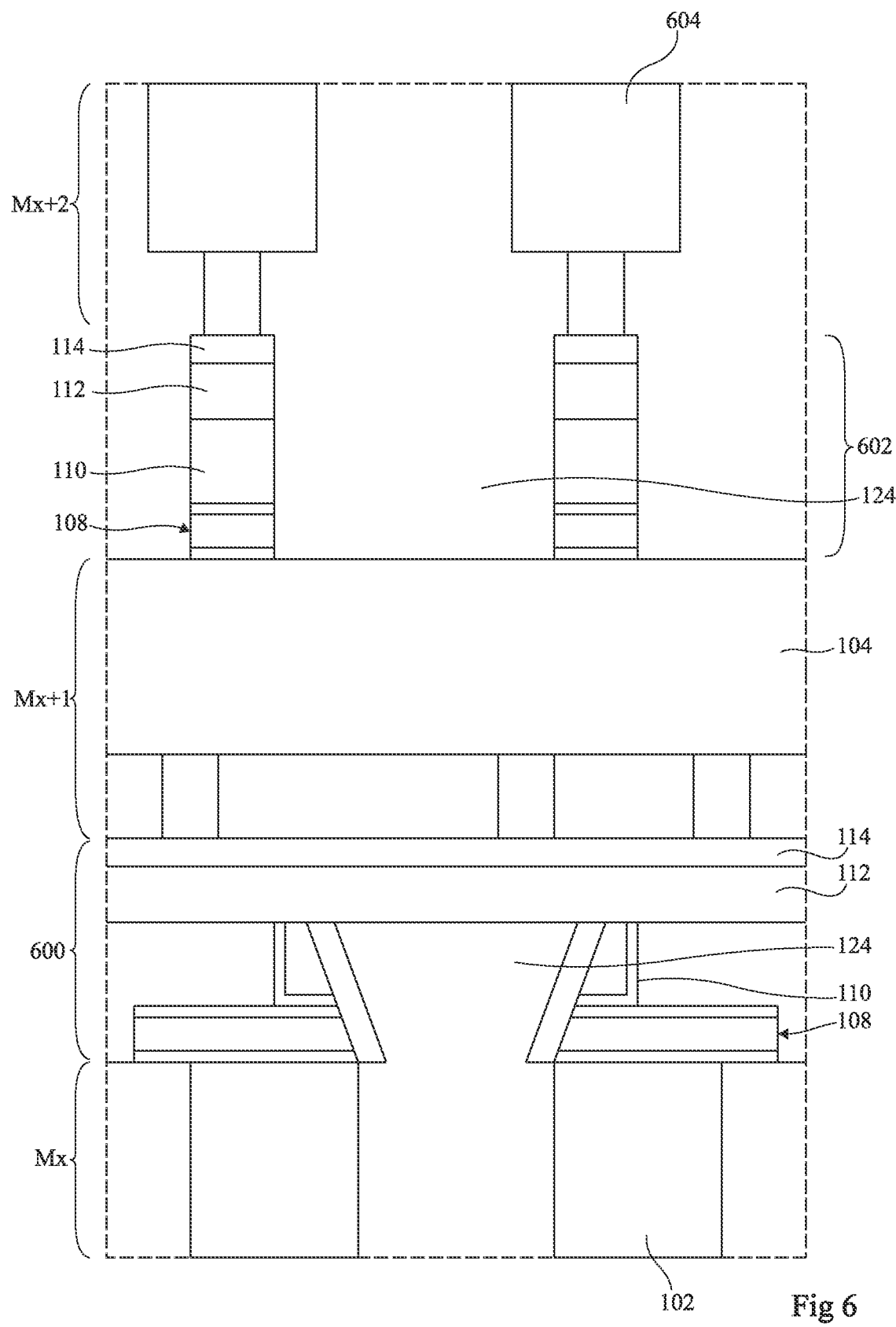
FIG. 6 schematically shows another embodiment of a memory device.

FIG. 6 schematically shows another embodiment of a memory device.

The memory device comprises first and second memory arrays 600 and 602 similar to the memory array described in relation with FIG. 1. The first memory array 600 is located between levels Mx and Mx+1 of an interconnection network and the second memory array 602 is located between levels Mx+1 and Mx+2 of the interconnection network.

Each conductive track 102 of level Mx interconnects the cells of a same row of array 600. Each conductive track 104 of level Mx+1 interconnects the cells of a same column of array 600 and interconnects the memory cells of a same row of array 602. Each conductive track 604 of level Mx+2 interconnects the memory cells of a same column of array 602. Thus, array 602 is rotated by 90° with respect to array 600.

More generally, an embodiment of a memory device may have any number of memory arrays, each comprising an assembly of memory cells, each array being located between two levels of conductive tracks of the interconnection network. The memory arrays may be separated by more than one level of consecutive conductive tracks.

As a variation, the number and the density of memory cells may vary from one array to another.

As a variation, the described embodiments are also applicable to resistive memory cells other than phase change memory cells.

An advantage of the described embodiments is that it is possible to increase the number of memory cells without increasing the surface area in top view, and thus the surface area of the substrate.

Another advantage of the described embodiments is that they enable to free space in the substrate to place other components therein.

Another advantage of the described embodiments is that the materials of the selector do not risk diffusing into the phase-change material and thus do not risk deteriorating it.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   writing data to a memory cell by changing a phase of a layer of phase change material of the memory cell, the memory cell including:
   an ovonic threshold switch having no mechanical contact with the layer of phase change material;
   a resistive element in contact with the ovonic threshold switch and positioned between the ovonic threshold switch and the layer of phase change material;
   reading data from memory cell by applying a read voltage across the ovonic threshold switch greater than a threshold voltage of the ovonic threshold switch.

2. The method of claim 1, wherein applying the read voltage causes the ovonic threshold switch to change from a substantially non-conductive state to a conductive state.

3. The method of claim 1, the ovonic threshold switch is part of a planar layer of ovonic threshold switches covering a lower level of conductive tracks.

4. The method of claim 3, wherein an insulating layer is positioned above of the layer of ovonic threshold switches.

5. The method of claim 1, wherein the ovonic threshold switch includes:
   a lower conductive layer;
   an upper conductive layer; and
   an alloy layer between the upper conductive layer and the lower conductive layer and including an alloy based on germanium and selenium.

6. The method of claim 1, wherein the resistive element has a substantially L-shaped cross-section.

7. A method, comprising:
   writing data to a first memory cell of a column of memory cells, the column of memory cells including a layer of phase change material common to each of the memory cells and a first conductive track electrically shorted to the layer of phase change material, each memory cell including:
   a respective ovonic switch completely physically separated from the layer of phase change material; and
   a respective resistive element in contact with the ovonic threshold switch and the layer of phase change material; and
   a respective second conductive track electrically shorted to the ovonic threshold switch and electrically isolated from the threshold ovonic switches of the other memory cells of the column; and
   reading data from the first memory cell by applying a read voltage between the first conductive track and the second conductive track of the first memory cell.

8. The method of claim 7, wherein the read voltage results in a voltage across the ovonic threshold switch greater than a threshold voltage of the ovonic threshold switch.

9. The method cell of claim 7, wherein each resistive element has a substantially L-shaped cross-section.

10. The method of claim 7, wherein the first conductive track is above the layer of phase change material.

11. The method of claim 10, wherein the second conductive tracks are positioned below the layer the of phase change material.

12. The method of claim 7, the ovonic threshold switches have a substantially planar shape.

13. The method of claim 7, wherein each ovonic threshold switch includes:
   a lower conductive layer;
   an upper conductive layer; and
   an alloy layer between the upper conductive layer and the lower conductive layer and including an alloy based on germanium and selenium.

14. The method of claim 13, wherein the lower and upper conductive layers are made of carbon.

15. A method, comprising:
   writing data to a first memory cell of a plurality of memory cells of memory array including:
   a first interconnection level including at least one first metal track in a dielectric layer;
   a second interconnection level including at least one second metal track in a second dielectric layer; and
   a layer of phase change material between the first interconnection level and the second interconnection level, each memory cell including a respective ovonic threshold switch between the first interconnection level and the second interconnection level and completely physically separated from the layer of phase change material; and
   reading data from the first memory cell by applying a read voltage between the first conductive track and the second conductive track of the first memory cell.

16. The method of claim 15, wherein each memory cell includes a respective resistive element in contact with the phase change material and the ovonic threshold switch.

17. The method of claim 16, wherein each ovonic threshold switch includes:
   a lower conductive layer;
   an upper conductive layer; and
   an alloy layer between the upper conductive layer and the lower conductive layer.

18. The method of claim 17, wherein the ally layer includes an alloy based on germanium and selenium.

19. The method of claim 18, wherein the lower conductive layer and the upper conductive layer are made of carbon.

20. The method of claim 19, wherein the interconnection network includes a third interconnection level above the second level, the memory device including a second memory cell between the second interconnection level and the third interconnection level.

\* \* \* \* \*